May 24, 1966 K. FRÄNZ ETAL 3,253,130

ANALOG TO DIGITAL CONVERTER

Filed Aug. 31, 1962 4 Sheets-Sheet 1

INVENTORS
Kurt Fränz
Jürgen Schulz &
Jürgen Gottschald

BY Spencer & Kaye
ATTORNEYS

May 24, 1966 K. FRÄNZ ETAL 3,253,130

ANALOG TO DIGITAL CONVERTER

Filed Aug. 31, 1962 4 Sheets-Sheet 2

INVENTORS
Kurt Fränz
Jürgen Schulz &
Jürgen Gottschald

BY Spencer & Kaye
ATTORNEYS

May 24, 1966 K. FRÄNZ ETAL 3,253,130

ANALOG TO DIGITAL CONVERTER

Filed Aug. 31, 1962 4 Sheets-Sheet 3

INVENTORS
Kurt Fränz
Jürgen Schulz &
Jürgen Gottschald

BY Spencer & Kaye
ATTORNEYS

May 24, 1966 K. FRÄNZ ETAL 3,253,130

ANALOG TO DIGITAL CONVERTER

Filed Aug. 31, 1962 4 Sheets-Sheet 4

INVENTORS
Kurt Fränz
Jürgen Schulz &
Jürgen Gottschald

BY *Spencer & Kaye*

ATTORNEYS

1

3,253,130

ANALOG TO DIGITAL CONVERTER

Kurt Fränz and Jürgen Schulz, Ulm (Danube), and Jürgen Gottschald, Neu-Ulm (Danube), Germany, assignors to Telefunken Patentverwertungs-G.m.b.H., Ulm (Danube), Germany Filed Aug. 31, 1962, Ser. No. 220,621
5 Claims. (Cl. 235—154)

The present invention relates generally to converters, and, more particularly, to an analog to digital converter for the digital coding of pulse amplitudes.

For the analog to digital conversion of pulse amplitudes in multichannel pulse height analyzers, methods which are based upon the Wilkinson principle are often used. In such methods, the pulse amplitude is stored during the analyzing process and is then converted into a time signal proportional to the pulse amplitude, e.g., a pulse having a duration proportional to this pulse amplitude. This time signal is quantized by a sine wave signal or a series of constant frequency pulses, and the number of time quanta included in this signal is represented by a digital value; see Schulz, "Einführung in den Aufbau von Diskriminatorschaltungen," "Kerntechnik" (Introduction into the Construction of Discriminator Circuits, Nuclear Technology) Vol. 2, 1960. In the above-mentioned Wilkinson method, a linear sawtooth voltage is used for converting signals carrying information in their pulse height into signals carrying information in their pulse duration. The sawtooth signal terminates when the sawtooth voltage and the stored pulse amplitude are equal. The duration of the sawtooth signal is proportional to the pulse amplitude.

In accordance with another method, a stepped voltage may be used instead of a sawtooth voltage wherein the steps are of equal height. With this method, the number of steps which need be provided to equal the stored pulse amplitude, will then be proportional to the pulse amplitude to be measured and represent a digital value.

The two methods are the same as far as the time required for analyzation is concerned. However, the analyzing time can theoretically be shortened if the step-wise method is used, but wherein the steps are unequal. This is accomplished by using higher or larger steps at first, for example, each may be the height of 10 times the channel width and these steps are used until the stored amplitude value is approached within ten channel widths. Then steps of equal height are used, each being equal to that of one channel width, and this is repeated until the stored pulse amplitude is attained. The number of ten channel width steps and unit channel width steps which are needed to build up the stepped curve to the value of the stored amplitude provides the digital value.

The analyzing time may be further shortened if the heights of the steps are staggered in a binary manner, that is, each step is half as high as the preceding one. When any of these steps is greater than the stored amplitude value, then, this particular step is removed and the subsequent step which is half as great is used. It may be assumed that in all of these methods the smallest analyzing time per step which can be used is of the same order of magnitude. Therefore, for 250 channels, using the maximum analyzing time for the above-mentioned three methods, there will be a proportion of 250:33:8. The analyzing time in the first two methods mentioned above may be shorter when small pulse amplitudes are involved, whereas in the last method this is not possible. Assuming that pulse amplitude distribution is uniform, the proportion of the analyzing times of the three methods changes to about 125:16:8. Therefore, the binary coding method is theoretically the fastest and furthermore provides a digital value in binary form which is advantageous for further processing.

2

In multichannel pulse height analyzers, the pulse amplitude must be accurate within 1% and the channel width must be accurate to within 1% of its value. Due to this requirement, the linearity of the sawtooth signal and the stability of the frequency of the sine wave in the Wilkinson principle must have an accuracy of about 1%. When steps of equal height are used for coding, they must each be accurate within 1% with respect to the height of the individual steps in order to fulfill the above-mentioned requirement. If the staggered type of coding is used with magnitudes of 10 unit steps and single unit steps, then the 10 unit steps must be accurate to within 0.1% and the single unit steps to within 1% with respect to their amplitudes.

If the analyzing times are shortened, it becomes necessary to increase the accuracy requirements. In order to fulfill the accuracy requirement in binary coding methods, the amplitude of the pulse to be analyzed would have to be kept constant to about 0.01% during the analyzing time. Thus, the largest coding step, which in the case of 256 channels would be an amplitude value of 128 channels in height, would have to be accurate to about 0.01%. The next coding step, which is half as high, would have to be accurate to about 0.02% etc. These requirements are difficult to attain if the time duration of each step is in the order of magnitude of about 1 microsecond.

With these defects of the prior art in mind, it is a main object of the present invention to provide for analyzation of the character described wherein the accuracy of the comparison steps and the constancy of the analog value, that is, of the pulse amplitude, may be substantially worse and wherein the aforementioned requirements as to channel width and linearity are still attained.

Another object of this invention is to provide an improvement in converting electrical analog values into digital values using comparison steps staggered in amplitude, particularly for the determination of pulse amplitude in multichannel pulse height analyzers for radiation measurements.

These objects and others ancillary thereto are accomplished according to preferred embodiments of the invention wherein a normal analyzing process is used, such as an analyzation method using binary steps with $2^n$ channels and after the $n$th comparison step, a control step is added to the determined or resulting comparison steps. The evaluation of the result obtained by means of the comparison steps is performed only if the analog value lies within the control step.

Additional objects and advantages of the present invention will become apparent upon consideration of the following description when taken in conjunction with the accompanying drawings in which.

Figure 1:
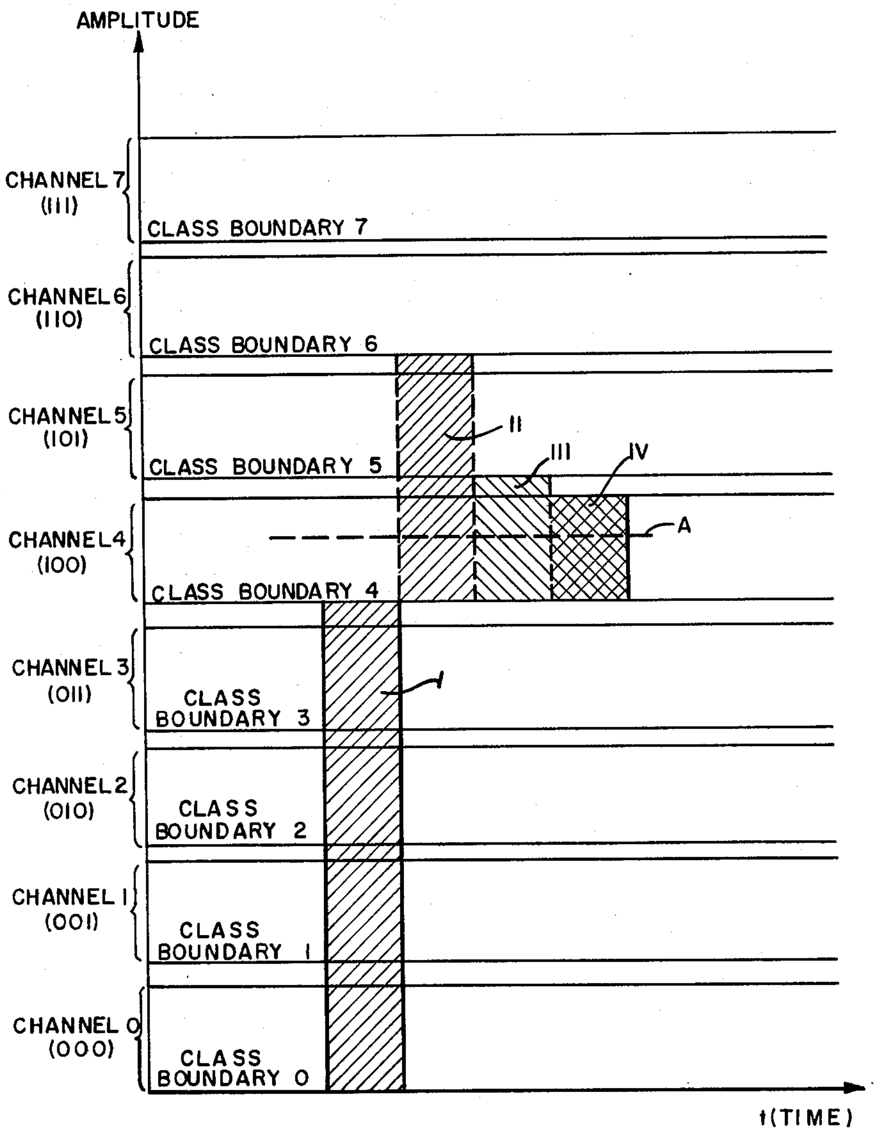
FIGURE 1 is a diagrammatic view graphically illustrating the concept of the present invention with relation to the analog value, which is indicated as being constant.
Figure 2:
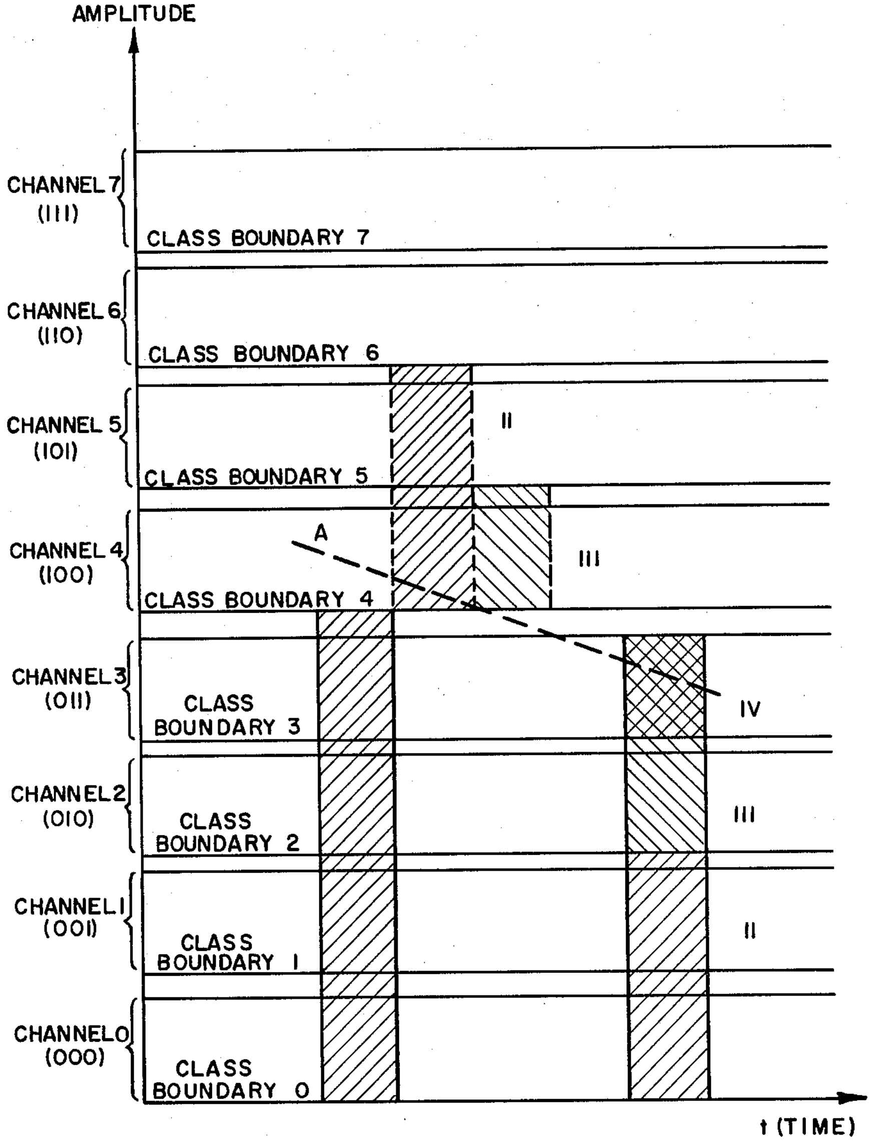
FIGURE 2 is a diagrammatic view similar to FIGURE 1, but wherein the analog value decreases with time.

With more particular reference to the drawings, FIGURES 1 and 2 graphically illustrate analyzation using the binary step method. For clarity of illustration, the amplitude range indicated on the ordinate is divided into only eight channels designated 0 to 7. Thus, the determination as to the channel into which a particular analog value, such as the dashed horizontal line A will fall, may be accomplished in three binary steps ($2^3=8$). The abscissa represents the time coordinate *t*.

Since, as is known, in binary coding the first comparison step is half as high as the maximum amplitude range which can be analyzed, the first comparison step I which is provided has an amplitude which forms a class boundary 4, this being half of the maximum range of 8 provided for purposes of illustration. At this time a comparison is performed to determine whether the analog value A is larger or smaller than the comparison step I. As may be seen in FIGURE 1, the analog value A is larger than the class boundary 4 and so in the first position of the binary number the digit ONE is stored.

Next, the comparison step II is provided in addition to comparison step I. Since in the binary coding method the second comparison step is of half the amplitude as the first comparison step, the sums of the amplitudes provide class boundary 6. However, this class boundary 6 is higher than analog value A and thus comparison step II is removed. Therefore, a ZERO is stored in the second position of the binary representation.

The amplitude of comparison step III is added to the amplitude of comparison step I. The sum of the comparison steps I and III provides a class boundary 5. A comparison is again made to determine whether the analog value A is larger or smaller than class boundary 5. In this case the analog value is smaller than class boundary 5 and accordingly step III is also removed. At this time a ZERO is placed in the third position of the binary number. Thus far, the binary result is thus 100 and this indicates that the analog value is between class boundaries 4 and 5.

If the amplitudes of the individual comparison steps exactly correspond to their nominal value, that is, if step I was exactly four channel widths, step II was exactly two channel widths, and step III was exactly one channel width, then the distance between two respective class boundaries would also correspond exactly to the channel width. However, as mentioned above, this is difficult to attain. Therefore, the difference between every two respective class boundaries, that is, the individual channel widths, will be of different size.

The amplitudes of the individual comparison steps are thus advantageously chosen to be larger than the nominal value. Thus, the distance between two respective class boundaries is always larger than the channel width used as a base.

Upon termination of the analyzing process when it has been determined where the analog value lies, for example, in the example indicated it lies between the lower class boundary 4 and the upper class boundary 5, a comparison step or control step IV is provided which is added to the lower class boundary. The amplitude of this comparison step corresponds exactly to the channel width which is used as a base. Should the analog value A be smaller than the sum of the lower class boundary and the control step together, as in the example, then the analog value will lie within channel 4 which in binary form is 100.

As indicated in FIGURE 1, there is a gap between each respective upper class boundary and the sum of the lower class boundary plus the control step. When an analog value is disposed within such a gap, the resulting digital value is not evaluated any further. The control step, which is always the same, therefore guarantees that the tolerance of individual channel widths is only equal to the tolerance of the control step amplitude.

FIGURE 2 illustrates the situation where the analog value A decreases, which is usually the case when an analog value is stored. For example, this may occur due to the discharge of a capacitor used for storing purposes.

Assuming that all analog values decrease at the same rate, then the instant at which the measuring of the analog value takes place, does not matter after analyzation has been started. However, the same instant should always be used after the beginning of analyzation. If it is assumed in addition that the decrease of the analog value does not vary by more than one channel breadth per analyzing time, then the requirement for a linearity of at least 1% may also be maintained even when the instant for measuring the amplitude of the analog value is at a later time instant than at the beginning of analyzation. Since the control step is only provided after analyzation, this instant must also be the reference for the pulse amplitude.

FIGURE 2 provides an example of a decreasing pulse wherein the analog value decreases to extend into the next lower channel during analyzation. As in the example of FIGURE 1 the first step aids in determining that the analog value A is above class boundary 4. Then the class boundary 6 is formed by the first step plus the second step and this is higher than the analog value. Therefore, step II is again removed and the class boundary 5 is formed by adding step I to step III which again is found to be higher than the analog value. Therefore, step III is also again removed and the binary result is 100. This would means that the analog value is between class boundaries 4 and 5 except for the fact that in the particular example being considered the analog value has fallen below class boundary 4 during analyzation.

According to the invention, a determination is made before the utilization of the control step. This is to determine whether the analog value A still is disposed above the lower class boundary 4. If this is not the case, then the analog value may lie in the gap below class 4 or in the lower channel. In this connection it should be noted that it is technically possible to provide for the analog value not decreasing by more than one channel width.

It must now be determined whether the analog value A is disposed within the gap or lies within the next lower channel. If it lies within the channel, then this value must be evaluated, and in the above example it will not be channel 4, or binary 100, but channel 3 or binary 011.

In practice this is accomplished in the following manner. Should the analog value reach a point below the lower class boundary 4, then the lower class boundary must be decreased or lowered by one. In the example under consideration the comparison step I must be removed and the comparison steps II and III added. In this manner the binary result is changed from 100 to 011.

It should be noted that usually the binary result is so changed that the last ONE of the binary number is changed to ZERO and the following ZEROS are all changed into ONES. For example, binary number 10101000 would be changed to binary number 10100111.

In the example being considered, control step IV is now added to the newly provided lower class boundary which is 3. If the analog value is below the sum of class boundary 3 plus the control step, the analog value is evaluated. In the example considered, the result is 011.

The decrease of the class boundary by one and the building up of the control step may be performed simultaneously. If the analog value is expected to decrease to a greater extent, then the class boundary may decrease several times. In a similar manner, it is possible to increase the class boundaries in those cases where the analog values increase.

This method of the present invention provides good results and minimum requirements as to tolerance because of the fact that channel width is solely determined by the amplitude of the control step and this amplitude is easy to keep constant within a range of at least 1% in actual practice. In a practical embodiment, the amplitude of the first comparison step is maintained constant within a range of 0.1%. The tolerance requirements of the following comparison steps are smaller yet corresponding to their smaller amplitudes.

The gaps which are shown in the figures are enlarged to an exaggerated degree and these gaps are in actual practice substantially smaller to the extent that the loss of information is less than 1%. The non-linearity which is caused by the gaps is less than 1% if the tolerance of the first step is kept within 0.1% and that of the second step 0.2% etc., and this is possible in actual practice.

Figure 3:
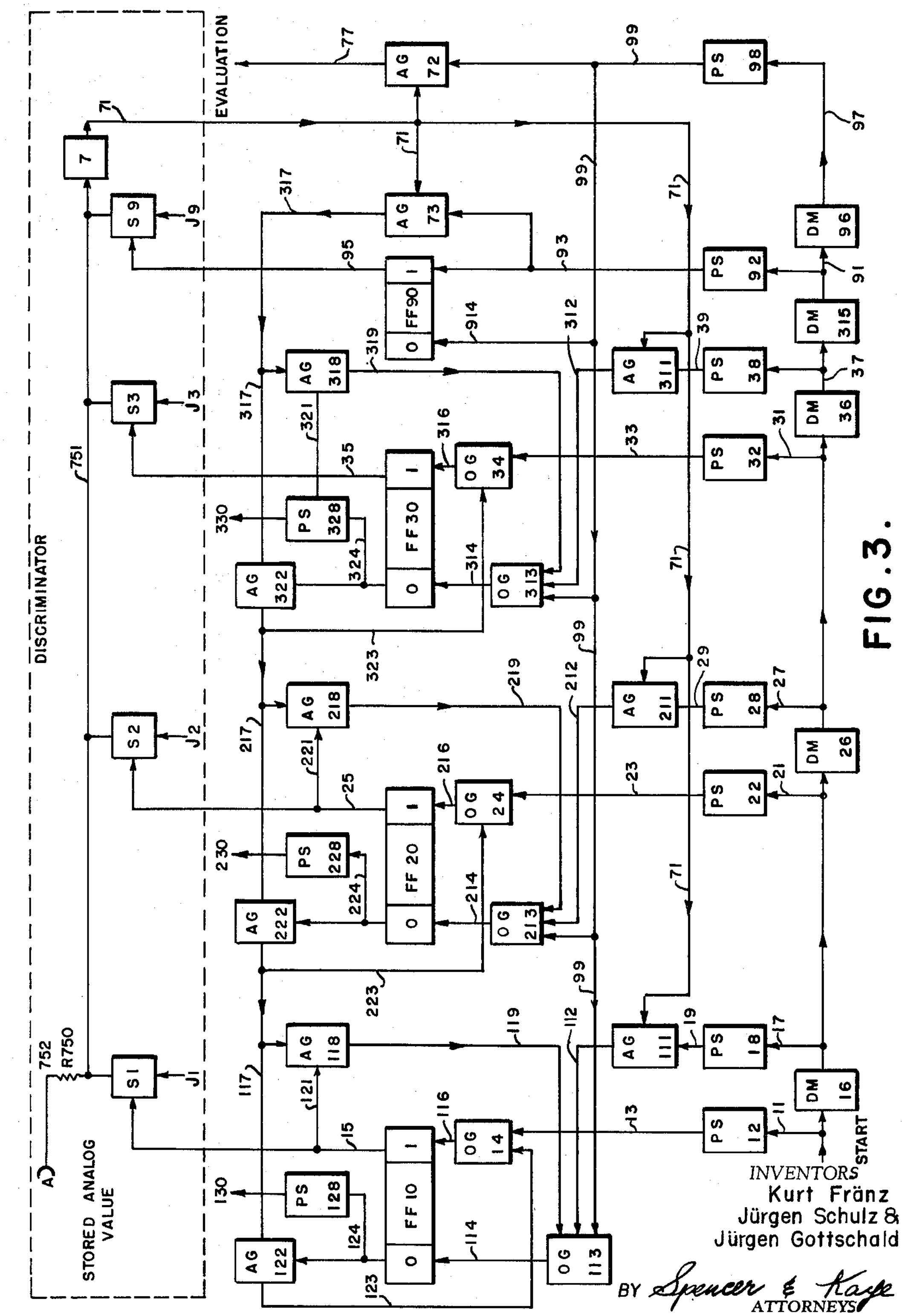
FIGURE 3 is a block diagram illustrating the voltage and/or current comparison circuit operating with three analyzing steps.

With more particular reference to FIGURE 3, a circuit for carrying out the method of the invention and using three analyzing steps is indicated. The main component of the analog digital converter is the current comparison circuit. In this example, the circuit comprises a resistor R750, the switches S1, S2, S3, and S9, the comparator 7, and the constant current sources J1, J2, J3, and J9.

In the example, the maximum amplitude of the analog value A which can be evaluated and which is a positive voltage will be assumed to be equal to voltage V. The circuit will then be capable of assigning analog value A to one of eight channels using the example of FIGURES 1 and 2. In this case, the following conditions are present:

$$J1=\frac{V}{2\times R750} \qquad J3=\frac{V}{8\times R750}$$

$$J2=\frac{V}{4\times R750} \qquad J9=\frac{V}{8\times R750}$$

If S1 is switched on, which is step I, then a determination is made whether or not A is larger or smaller than the class boundary 4, i.e., whether A is larger or smaller than $J1\times R750=\frac{1}{2}V$. If A is larger than $J1\times R750$, then a positive voltage is applied to conductor 751. If A is smaller than $J1\times R750$, then a negative voltage is applied to line 751. Comparator 7 makes a determination as to whether this potential at 751 is positive or negative and in dependence thereon delivers a corresponding signal at its output which is suitable for further processing. The second step is initiated by switching S2 on and the above described process is repeated in a corresponding manner, and this is also true for the subsequent steps.

As was mentioned above, the comparison steps are to be increased above the nominal value mentioned so that there will be small gaps between the channels. In order to provide for this, the currents J1, J2, and J3 must be increased by an amount which results from the maximum tolerance to be allowed in the comparison steps.

The circuit of FIGURE 3 will now be explained and it is believed that the form of an example will clearly provide an understanding of this circuit. It will be assumed that the circuit is ready for analyzing, that is, the flip-flops FF10, FF20, FF30, and FF90 are in condition ZERO. Thus, there is no voltage at lines 15, 25, 35 and 95, and therefore the switches S1, S2, S3, and S9 are open.

The analog value A is applied to the input of the circuit of FIGURE 3 and is indicated as the stored analog value. In order to begin the analyzation process, a starting pulse is applied in the lower left-hand portion of the circuit and this starting pulse is applied to line 11 from a point exteriorly of the circuit. This starting pulse controls the entire chronological progression of analyzation by means of the delay lines DM16, DM26, etc. This starting pulse is properly shaped by pulse shaper PS12 so that it may switch a flip-flop. This shaped starting pulse arrives at one of the inputs of flip-flop FF10 by means of line 13, OR-gate OG14, and line 116. This places flip-flop 10 into the ONE condition. A voltage now appears on line 15 and the AND-gate AG118 via line 121 receives a signal at one of its inputs and therefore places it in a condition which renders it ready for operation should a signal be received at its other input. The significance of this will be explained in detail below.

The signal applied to line 15 closes switch S1 and a current J1 flows through resistor R750. Since the value A is assumed to be larger than class boundary 4 just as in the example indicated in FIGURES 1 and 2, which means larger than one half V, a positive voltage will appear on line 751. The comparator 7 then delivers a positive voltage at its output. The AND-gates AG72, AG73, AG111, AG211, and AG311, are responsive to negative signals only and accordingly, the output line 71 of the comparator provides signals of the type which block the above-mentioned AND-gates.

The above-mentioned AND-gates are responsive only to negative signals and the output of comparator 7 to its line 71 will be a negative signal. When a positive signal is aplied to one input of an AND-gate, such gate may be considered as being blocked. Such positive signal may be either the absence of a signal or a signal which is not sufficient to affect the inputs of the AND-gates.

For the present only the AND-gate 111 is of interest. At this time the starting pulse at line 11 arrives at line 17 after being delayed by DM16. This pulse then goes through pulse shaper PS18 and then by line 19 to the blocked AND-gate AG111 which is blocked due to the type of signal provided to the input thereof by line 71. Because of this, even though the output of the AND-gate AG111 leads to an OR-gate 113 by a line 112, and line 114 at the output of the OR-gate OG113 is connected to the ZERO condition input of flip-flop FF10, this delayed starting pulse cannot return the flip-flop FF10 to ZERO since AND-gate AG111 is blocked. Therefore, the switch S1 remains in its closed condition which is exactly as is desired when value A is larger than class boundary 4 as is the case under consideration.

At the same time, the delayed starting pulse, which is delayed by DM16, passes through pulse shaper PS22, via line 21 which is the input to PS22, and then to the output line 23 of PS22 into OR-gate OG24 to its output line 216 into the ONE condition input of flip-flop FF20 which places this flip-flop into the ONE condition. Accordingly, there is a signal on the output line 25 of this flip-flop and the switch S2 is placed into the on condition.

At this point both currents J1 and J2 flow through resistor R750 and thus the value A is compared with class boundary 6. Since the analog value A is smaller than the class boundary 6, a negative voltage appears on line 751 and the comparator 7 provides a negative voltage on line 71. Accordingly, the AND-gates AG72, AG73, AG111, AG211, and AG311, are placed into their open or unblocked condition because a proper negative signal is applied to one of their respective inputs, and if another signal appears on the other of their respective inputs, the AND-gates will provide an output signal.

After a certain period of delay, which is provided by delay line DM26, the starting pulse is applied to line 27 and is shaped by the pulse shaper PS28 from which the pulse appears on line 29 and is introduced to AND-gate 211. Since the AND-gate AG211 has a proper input from line 71 and a proper input from line 29, the AND function is provided and an output will appear on line 212. This is fed to OR-gate 213 and line 214 to the ZERO input of flip-flop FF20 and places the flip-flop into the ZERO condition. This has the effect of removing the potential from line 25 and opening switch S2.

Simultaneously with the above-mentioned operation, the delayed starting pulse also appears on line 31 and is accordingly introduced into pulse shaper PS32 along line 33 to OR-gate OG34, through line 316 into the ONE input of flip-flop FF30. A signal then appears on line 35 and this closes switch S3 thereby adding currents J1 and J3. Since the analog value A is smaller than class boundary 5 which is now provided because of the added currents $J1+J3$, a negative voltage will appear on line 751. Then, as mentioned above, the line 71 will have a negative voltage appearing thereon and the AND-gates AG72, AG73, AG111, AG211, and AG311, will remain in their open condition wherein they are ready to provide an output if a signal is applied to their respective other input lines.

The starting pulse is delayed by delay line DM36, and arrives on line 37 to the pulse shaper PS38, along its output line 39 to the AND-gate AG311. Since signals are now being applied to the AND-gate 311 along input 71 and input 39, an output signal will appear on line 312 and be introduced to OR-gate OG313. The signal passes along line 314 to the flip-flop FF30 and places it into the ZERO condition whereupon the switch S3 is opened.

At this time, then, only switch S1 is in the closed condition. Therefore, the analog value is larger than class boundary 4 and a positive voltage again appears on line 751 which places the AND-gates AG72, AG73, AG111, AG211, and AG311 into the blocking condition. It must then be determined whether the analog value A lies within the channel width of channel 4 and this is accomplished by using the control step.

The starting pulse is relayed by delay line DM315 and arrives through line 91 at the pulse shaper PS92 and then at the line 93 and the input of flip-flop FF90 and places it into the ONE condition. Since the AND-gate AG73 is blocked as mentioned above, the starting pulse will not arrive at line 317 which is the output from AND-gate AG73. At this time, the control step is provided by the closing of switch S9 by means of a signal on line 95. Since the analog value A is smaller than the class boundary 4 and the control step, both taken together, a negative voltage appears on line 751 whereby the AND-gates AG72, AG73, etc. are opened.

The starting pulse which has been delayed by delay line DM96 appears on line 97 and is introduced to pulse shaper PS98 and thence to line 99, to the open AND-gate AG72 which has a signal applied on its input 71 and also on its input 99. Accordingly, an output is provided on line 77 which has the effect of providing an evaluating signal to the next following circuit. This means that the digital value contained in the flip-flops FF10, FF20, FF30, will be processed further.

At the same time that the signal is introduced to AND-gate AG72 by means of line 99, the above-mentioned pulse passes along line 99 and is applied to the OR-gates OG113, OG213, and OG313, and thus a signal is applied to the ZERO condition inputs 114, 214, and 314 of the flip-flops. This signal from line 99 is also applied to line 914 and the ZERO input of flip-flop FF90, and thus all of the flip-flops are set to ZERO.

The flip-flops FF20 and FF30 are already in the ZERO condition and accordingly no output will be produced on the respective lines 224 and 324 and thus at the pulse shapers PS228 and PS328, respectively. However, the flip-flops FF10 and FF90 now change over to the ZERO condition and whenever FF10 changes condition, the voltage appearing on line 124 changes and the pulse shaper PS128 provides a pulse to the delivering line 130 which is to deliver this digital value to the next following circuit. However, since, as was mentioned above, no signal appears on lines 224 and 324, there will be no pulse applied to the digital value delivering lines 230 and 330.

Thus, when the flip-flops are reset, the result of the analyzation process is delivered to further circuitry for further processing and in the example indicated a pulse appears at line 130, and no pulses appear at lines 230 and 330. Thus, expressed in a binary manner, this will be channel 100, or expressed in a decimal manner, channel 4. The following circuitry is constructed to process pulses appearing at the digital value delivering lines only if a pulse is present at line 77 at the same time, so that the presence or absence of a signal on line 77 determines whether or not the results of the analyzation will be evaluated.

Should an analog value A be disposed in the gap above channel 4 (100), analyzation would be carried out in the same manner as indicated above. However, after the control step, when switch S9 is placed into conducting condition, a positive voltage would appear on line 751 because the analog value is larger than the class boundary 4 plus the control step. A positive voltage would appear on line 71 and thus block the AND-gates AG72, AG73, etc. The delayed starting pulse on line 99 would place all of the flip-flops into ZERO condition but it cannot arrive on line 77 due to the AND-gate AG72 which is in blocked condition, that is, there is not a proper signal on its input 71. Accordingly, there would be no evaluating signal and the following circuitry would not accept signals on the digital value delivering lines 130, 230, and 230.

It will now be assumed that the analog value A decreases with time as indicated in connection with FIGURE 2. The analyzation process is first performed as mentioned above. The switch S1 remains closed and switches S2 and S3 are opened after closing for a short period of time during the process. However, the analog value during this time has become smaller than ½V and while the pulse is being delayed in delay line DM315, only the current J1 is being applied but the analog value is smaller than ½V which is the voltage appearing across R750. Therefore, the potential which then appears on line 751 is negative and the AND-gates AG72, AG73, AG111, AG211, and AG311 are opened or placed into the condition wherein they are ready to provide an output should their respective other inputs receive a signal, and this is done by line 71 which is the output line from the comparator 7.

The starting pulse is delayed by delay line DM315 and passes to the line 91 to the pulse shaper PS92 to line 93 and places flip-flop FF90 into its ONE condition. Also this pulse is applied to the input of AND-gate AG73. Since there is also a signal on input 71 of this AND-gate, a signal appears on the output line 317 of the AND-gate AG73.

A pulse on the line 317 has the effect of providing a step which changes the last digit which is ONE into a ZERO and changing all of the subsequent ZEROS into ONES. Considering the example which has been discussed in connection with FIGURE 3, flip-flop FF30 is in condition ZERO. Accordingly, there is no voltage on line 35 and the AND-gate 318 is therefore blocked by the line 321 since no signal appears at this input of the AND-gate. Accordingly, a pulse on line 317 will not be transmitted to line 319.

Since the flip-flop is in the ZERO condition, a voltage does appear on line 324 and this is one of the inputs to AND-gate 322, the other input of which is line 317. Accordingly, the AND-gate 322 is opened and a signal appears at its output line 217. When this occurs, an output signal also appears in line 323 and a signal is applied to OR-gate OG34 which places flip-flop FF30 into the ONE condition.

The pulse on line 217 is applied to the input of AND-gate AG218 and also to the AND-gate AG222. Flip-flop FF20 is in the ZERO condition and therefore the AND-gate AG218 is closed or blocked and the AND-gate AG222 is opened so that an output signal appears on its output line 117 and also on 223. Line 223 provides a signal to the OR-gate OG24 and the flip-flop FF20 is accordingly set to the ONE condition.

The signal on line 117 is applied to the AND-gate AG118 and the input of AND-gate 122. However, since flip-flop FF10 is in its ONE condition, the AND-gate AG122 does not receive a signal upon one of its inputs and it is accordingly blocked due to the absence of a signal on line 124. The AND-gate AG118 is open because of signals on lines 121 and 117. Since a pulse appears on line 117 and passes through the AND-gate 118, it is delivered by line 119 to the OR-gate OG113 and its output line 114 and places the flip-flop FF10 into the ZERO condition. The pulse on line 117 cannot pass through the blocked AND-gate 122 and, accordingly, it cannot appear at any flip-flops which may be provided in front of the gate AG122.

It may thus be seen that due to the pulses on lines 317, 217, and 117, the flip-flops and switches are changed from binary position 100 to binary position 011. Simultaneously with this, switch S9 is closed as mentioned above.

Accordingly, the comparator 7 now compares the analog value with class boundary 3 plus the control step, rather than with class boundary 4 plus the control step as occurred in the example discussed above. Line 751 will then have a negative potential appearing thereon and so will the line 71 which opens the AND-gates AG72, AG73, etc. The starting pulse which is delayed by DM96 now arrives at line 97 and is introduced, through pulse shaper PS98, line 99, and the AND-gate AG72, to line 77 where the evaluation signal may be provided to the following circuit and the contents of the flip-flops may be processed further.

In the block diagram circuit of FIGURE 3, circuit components in the form of AND-gates, OR-gates, pulse shapers, delay lines, flip-flops, switches, and a comparator are provided. The first five of these circuit components listed are sufficiently well known circuit arrangements in digital computing techniques that they need not be described any further. For example, see Millman and Taub, "Pulse and Digital Circuits." The switches are fast electronic switches such as those of the transistor type. The comparator is also required to operate very quickly and must have high amplification since, with an input voltage of 1% of the channel breadth, it must deliver a voltage at its output which is sufficient for opening the connecting gates.

Figures 4, 5:
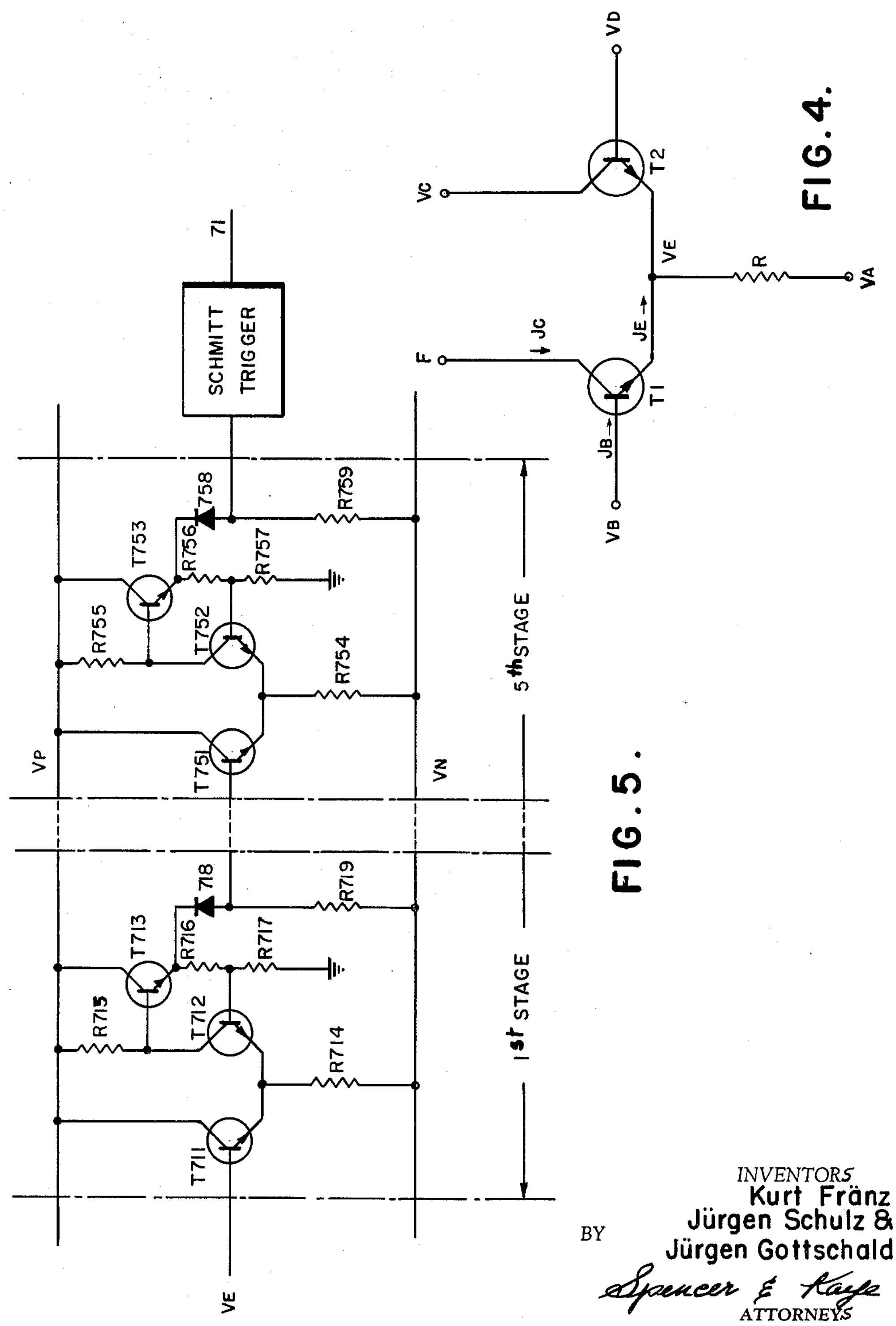
FIGURE 4 is a circuit diagram of a switch having a constant current source.
FIGURE 5 is a circuit diagram of a comparator circuit.

The switch having a constant current source and being of the type which may be used as switches in the above described system is illustrated in detail in FIGURE 4. The collector of transistor T1 delivers the constant current to point F, which is to be connected to line 751 of FIGURE 3. The current $JE=JC+JB$ and accordingly $JC=JE-JB$. Also, $JC=JE(1-1/\beta)$ where $\beta$ is the current amplification of the transistor. JE is provided when transistor T2 is blocked. The voltage applied to resistor R divided by the resistance thereof provides the current JE. The voltage across resistor R is the same as the voltage between VA and VB, minus the base emitter voltage of T1. If the voltage between VA and VB is sufficiently high, then a change in the base emitter voltage of T1 will substantially not influence the collector current JC when there is a change in temperature. The influence of a change in $\beta$ upon this collector current JC may be kept to a small amount by using transistors having a high $\beta$.

The voltage VD applied to the base of T2 may be assumed to be the voltage which appears on line 15 of FIGURE 3. When this voltage attains a particular value, transistor T2 may become conductive and the entire current flow through resistor R occurs through transistor T2. At this time only the residual collector current will still flow in the collector branch of transistor T1 and it is thus in the blocked condition, i.e., the switch is closed. When silicon transistors are used, this residual collector current is of the magnitude of $10^{-9}$ amperes and therefore need not be considered.

The current J1 of FIGURE 3 is the current through resistor R minus the basic current JB of FIGURE 4. When the transistor T2 is conductive, the potential VE is equal to the voltage VD minus the base emitter voltage of T2, and the transistor T1 is cut-off. $U_c$ is the supply-voltage for transistor T2 and remains substantially constant. At this time, the switch is in its "off" condition.

The comparator of the type which may be used in connection with the present invention is indicated as element 7 in FIGURE 3 and is disclosed in somewhat greater detail in FIGURE 5. In the example under consideration, the comparator includes five amplifying stages which are equal and which are galvanically coupled, and a Schmitt trigger of known construction connected after this arrangement. (See Pulse and Digital Circuits, Millman and Taub, McGraw-Hill.) Since rapid operation and stability are desired, a difference feedback amplifier having five-fold amplification is used as the individual amplifiers, and two of the five amplifier stages are indicated in FIGURE 5, these being the first and the last.

Transistor T711 is an emitter follower, and when the input voltage VE becomes more positive, then the voltage at the emitters of transistors T711 and T712 becomes more positive by an equal amount. Thus, the base-emitter voltage of T712 becomes less, as does the collector current through T712. Accordingly, the voltage drop across R715 becomes smaller whereby the voltage appearing at the emitter of T713 becomes more positive.

The emitter voltage of T713 encounters a voltage divider including resistors R716 and R717 and is applied to the base of T712 in the form of a feed back voltage. The relationship of the voltage divider R716 and R717 thereby determines the amplification of the first stage. This first amplifier stage is galvanically connected with the subsequent stages by means of a Zener diode 718. When the signal finally arrives at the output of step 5 it is applied to the input of a Schmitt trigger, the output of which is the line 71.

It should be noted that in those cases where the analog value increases, the arrangement may be such that after the comparison steps are finished and thus after analyzation, the control step is used as when the analog value decreases. However, if the analog value is not within the control step, then the final comparison value is increased in a stepwise manner by one channel until the analog value is within the last of the control steps to be added to the final comparison value.

It should be noted that the present invention is not limited for use with an analyzing process wherein the amplitudes of the comparison steps are staggered in a binary matter, but may also be used with a different type of staggering of the amplitudes of the comparison steps, for example, with 10 units and single unit steps.

It will be understood that the above description of the present invention is susceptible to various modifications, changes, and adaptations, and the same are intended to be comprehended within the meaning and range of equivalents of the appended claims.

In the claims:

1. Apparatus for converting electrical analog values into digital values comprising, in combination:

(a) means for analyzing an analog value using comparison steps;

(b) means for adding a control step to the steps resulting from analyzation and connected to said analyzing means for activation subsequent thereto; and (c) means connected with said analyzing means and said adding means for permitting evaluation of the result obtained by means of the resulting comparison steps only when the analog value is within the control step.

2. Apparatus for converting electrical analog values into digital values, comprising, in combination:

(a) means for analyzing an analog value using comparison steps which are staggered with respect to amplitude and having amplitudes which are always at or above their nominal value;

(b) means for adding to the steps resulting from analyzation a control step having an amplitude which is smaller than the last comparison step and thus smaller than the difference between two corresponding boundaries of adjacent channels and connected to said analyzing means for activation subsequent thereto; and (c) means connected with said analyzing means and said adding means for permitting evaluation of the result obtained by means of the resulting comparison steps only when the analog value is within the control step when the control step is added to the steps resulting from analyzation.

3. Apparatus as defined in claim 2 comprising means connected to said analyzing means for causing comparing of the final comparison value with the analog value after the end of analyzation when the analog value is decreasing and for causing said adding means to add the control step: (1) to the actually resulting comparison steps when the analog value is larger than the final comparison value, and (2) to an adjusted final comparison value when the analog value is other than larger than the final comparison value, and means connected with said comparing causing means for forming an adjusted comparison value which is one unit digit smaller than the final comparison value when the analog value is other than larger than the final comparison value.

4. Apparatus as defined in claim 3 wherein said adjusted comparison value forming means are arranged to continually decrease the comparison value by one digit until the final comparison value is smaller than the analog value.

5. Apparatus for converting electrical signals significant of analog values into electrical signals significant of digital values, comprising, in combination:

(a) means for analyzing an electrical value significant of an analog value using stepped comparison signals which are staggered with respect to amplitude and having amplitudes which are always at or above their nominal value;

(b) means for adding to the comparison signals resulting from analyzation a control signal having an amplitude which is smaller than the last comparison signal and thus smaller than the difference between two corresponding amplitudes of adjacent stepped comparison signals and connected to said analyzing means for activation subsequent thereto; and (c) means connected with said analyzing means and said adding means for permitting evaluation of the result obtained by means of the resulting comparison signals only when the electrical signal significant of the analog value is within the control signal when the control signal is added to the signals resulting from analyzation.

References Cited by the Examiner

UNITED STATES PATENTS 2,784,396 3/1957 Kaiser et al. ---------- 235—154

MALCOLM A. MORRISON, *Primary Examiner.*

J. S. IANDIORIO, W. J. KOPACZ, *Assistant Examiners.*